(12) United States Patent
Debnath et al.

(10) Patent No.: US 10,727,861 B2
(45) Date of Patent: Jul. 28, 2020

(54) EXCESS LOOP DELAY ESTIMATION AND CORRECTION

(71) Applicant: Maxlinear, Inc., Carlsbad, CA (US)

(72) Inventors: Chandrajit Debnath, Bengaluru (IN); Abhishek Ghosh, Bengaluru (IN); Rishi Mathur, Bengaluru (IN); Anand Mohan Pappu, Bengaluru (IN)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 16/438,842

(22) Filed: Jun. 12, 2019

(65) Prior Publication Data

US 2019/0379390 A1 Dec. 12, 2019

Related U.S. Application Data

(60) Provisional application No. 62/702,537, filed on Jul. 24, 2018.

(30) Foreign Application Priority Data

Jun. 12, 2018 (IN) .............................. 201811021868

(51) Int. Cl.
*H03M 3/00* (2006.01)
*G06F 7/58* (2006.01)

(52) U.S. Cl.
CPC .............. *H03M 3/458* (2013.01); *G06F 7/58* (2013.01); *H03M 3/39* (2013.01)

(58) Field of Classification Search
CPC ............ H03M 3/458; H03M 3/39; G06F 7/58

USPC .................................................. 341/125–155
See application file for complete search history.

(56) References Cited

U.S. PATENT DOCUMENTS

| | | | |
|---|---|---|---|
| 6,473,011 B1* | 10/2002 | Steensgaard-Madsen .................. | H03M 1/0673 341/118 |
| 7,038,532 B1* | 5/2006 | Bocko ..................... | G06G 7/186 327/337 |
| 9,344,271 B1* | 5/2016 | Dusatko ................ | H04L 7/0331 |
| 2002/0159533 A1* | 10/2002 | Crawford ............ | H04L 27/2657 375/260 |
| 2005/0068212 A1* | 3/2005 | Jensen .................. | H03M 3/332 341/143 |

(Continued)

*Primary Examiner* — Lam T Mai
(74) *Attorney, Agent, or Firm* — Maschoff Brennan (57) ABSTRACT

An analog-to-digital convertor circuit converts the output of a loop filter circuit to a digital signal. A random sequence generation circuit generates a random sequence. Adder circuitry adds the random sequence to the digital signal to generate a randomized digital signal. Noise transfer function impulse response detection circuitry processes the randomized digital signal and the random sequence to determine a noise transfer function impulse response. Loop filter configuration circuitry configures the loop filter circuit based on the noise transfer function impulse response. The random sequence generation circuit may comprises a high-pass sigma delta modulator. The noise transfer function impulse response detection circuitry may determine the noise transfer function impulse response, and the loop filter configuration circuitry may configure the loop filter based on the noise transfer function impulse response. The loop filter configuration circuitry may generate loop filter coefficients based on the noise transfer function impulse response.

20 Claims, 7 Drawing Sheets

(56) References Cited

U.S. PATENT DOCUMENTS

| | | | |
|---|---|---|---|
| 2007/0069931 A1* | 3/2007 | Hsieh | H03M 3/38 |
| | | | 341/143 |
| 2010/0103003 A1* | 4/2010 | Deval | H03M 3/33 |
| | | | 341/118 |
| 2011/0037631 A1* | 2/2011 | Lai | H03M 1/1004 |
| | | | 341/120 |
| 2016/0065223 A1* | 3/2016 | Galton | H03L 7/197 |
| | | | 327/159 |
| 2016/0204794 A1* | 7/2016 | Quiquempoix | H03M 1/0641 |
| | | | 341/131 |

\* cited by examiner

EXCESS LOOP DELAY ESTIMATION AND CORRECTION

PRIORITY CLAIM

This application claims priority to Indian provisional patent application 201811021868 filed Jun. 12, 2018 and U.S. provisional patent application 62/702,537 filed on Jul. 24, 2018, each of which is hereby incorporated herein by reference in its entirety.

BACKGROUND

Limitations and disadvantages of conventional and traditional approaches to handling loop delay will become apparent to one of skill in the art, through comparison of such systems with some aspects of the present invention as set forth in the remainder of the present application with reference to the drawings.

BRIEF SUMMARY OF THE INVENTION

A system and/or method is provided for excess loop delay estimation and correction, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Continuous-time sigma-delta ADCs, being feedback systems in continuous-time, are quite sensitive to loop delays. In accordance with aspects of this disclosure, an extra random sequence c[n] at the least significant bit (LSB) level is added to the quantizer output. The impulse response of the noise transfer function is then estimated by correlating the ADC output with the appropriately delayed sequence c[n-k], where n and k are integers. Any deviation in the impulse response set from their desired value can be compensated by modifying the loop coefficients. This enables a robust run-time operation without fear of loop instability or loss of performance.

Figure 1A:
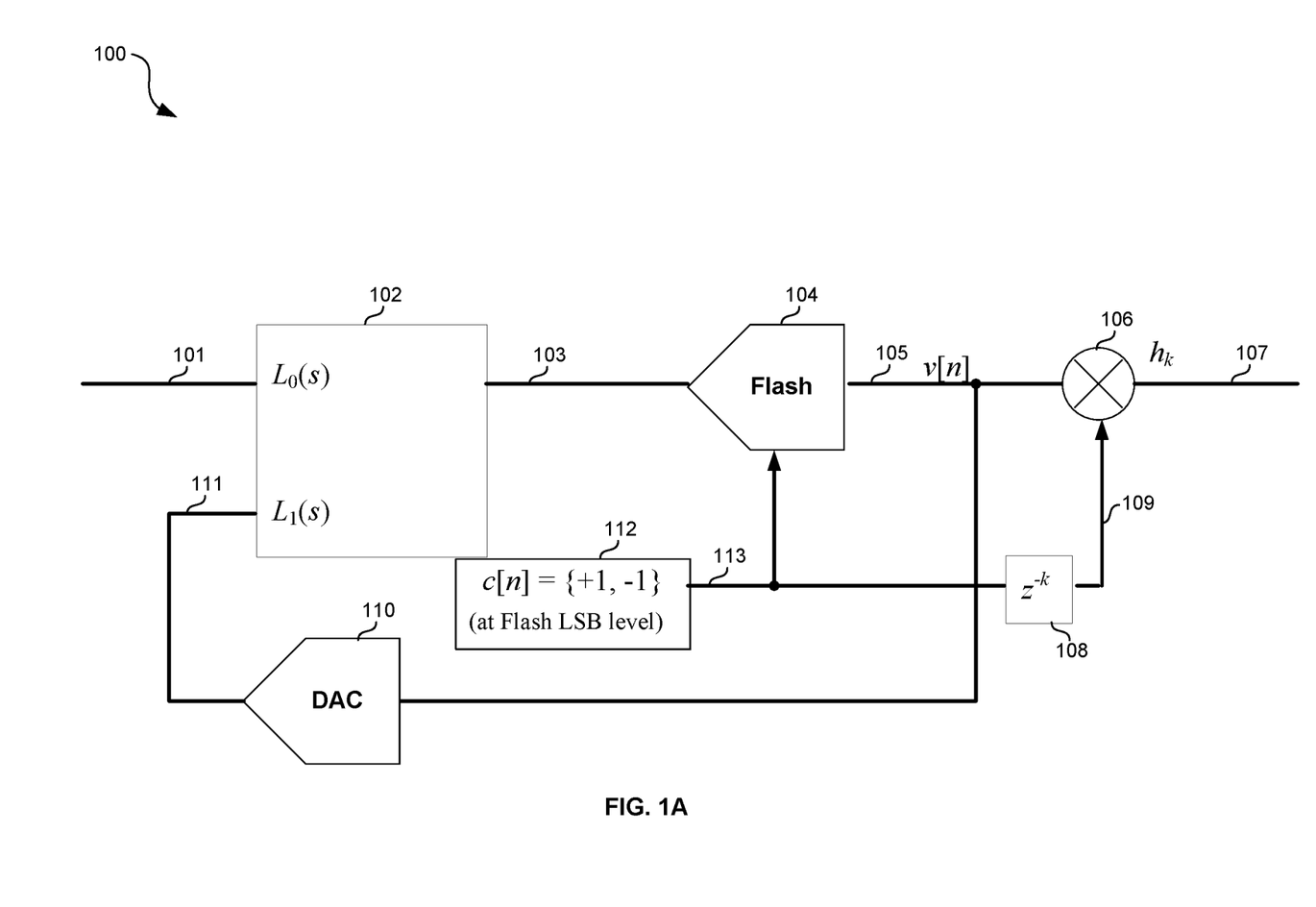
FIG. 1A shows an example implementation of a sigma-delta ADC configured for excess loop delay estimation and correction.

FIG. 1A shows a first example implementation of a sigma-delta ADC configured for excess loop delay estimation and correction. The ADC 100 comprises a loop filter 102, a flash ADC 104, a correlator circuit 106, a delay circuit 108, a digital to analog converter (DAC) 110 and random sequence generation circuit 112.

The loop filter 102 is operable to filter signal 101 to generate signal 103. The transfer function of the loop filter 102 is configured based on the feedback signal 111 from DAC 110. Example circuitry of the loop filter 102 is described below with reference to FIGS. 4A and 4B.

The flash ADC 104 (e.g., a 5-bit flash) is operable to convert the analog signal 103 to a corresponding digital representation y[n] (referred as 105).

The delay element 108 is operable to delay the random sequence c[n] (called out as 113) by an appropriate amount to match the delay introduced by the flash ADC 104 and the loop filter 102, resulting in delayed random sequence 109.

The correlator circuit 106 receives the noise transfer function impulse response, $h_k$, and the delayed random sequence with the flash output 105 to generate the noise transfer function impulse response, $h_k$. In an example implementation, the circuit 106 comprises a multiplier, but in other implementations it may comprise any circuitry operable to determine the correlation between signals 105 and 109.

The DAC 110 is operable to convert the digital signal 105 to a corresponding analog signal 111.

The random sequence generation circuit 112 is operable to generate the random sequence c[n] using any known random sequence or pseudo-random sequence generation algorithm.

Figure 1B:
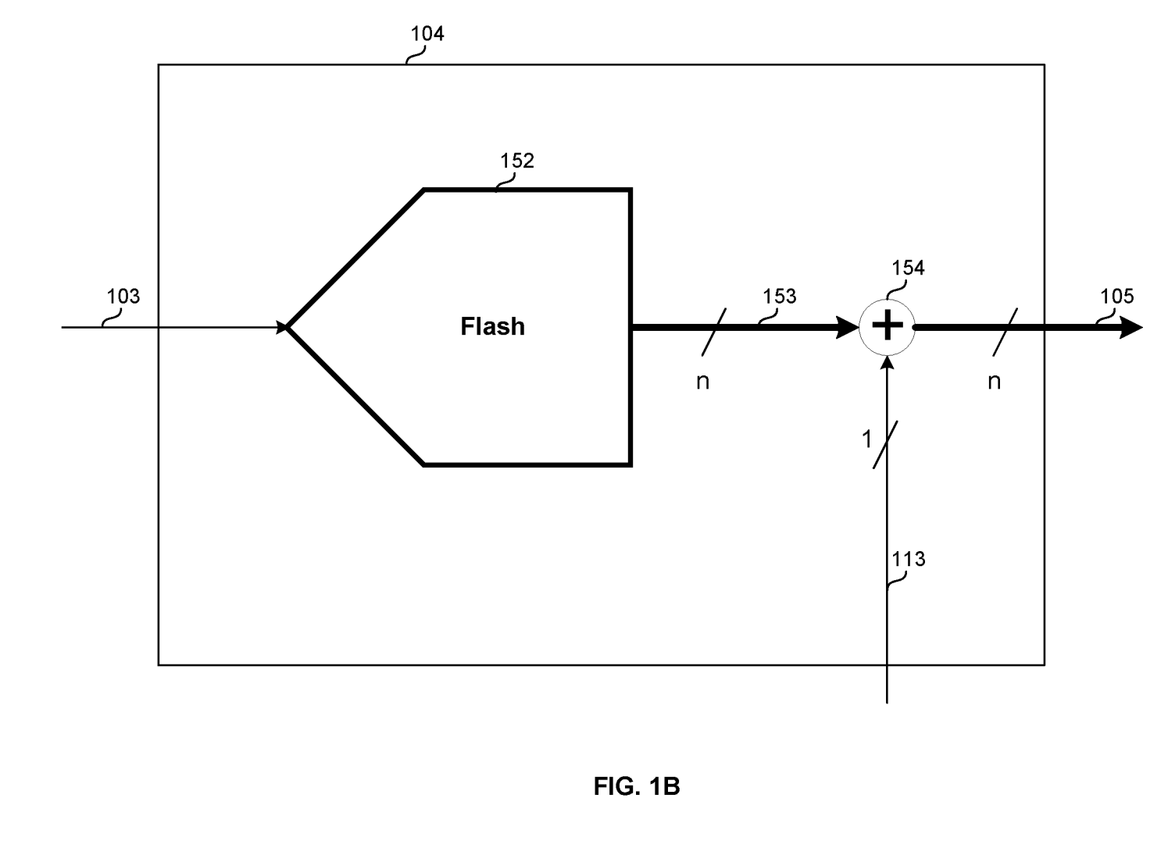
FIG. 1B shows an example implementation of the flash ADC of the sigma-delta ADC of FIG. 1A.

FIG. 1B shows an example implementation of the flash ADC of the sigma-delta ADC of FIG. 1A. The example flash ADC 104 comprises n-bit analog-to-digital conversion circuit 152 and adder 204. The random sequence c[n] is added (in adder 154) to the output 153 of the circuit 152 to generate the digital signal 105.

One drawback of adding the random sequence c[n] to the output of the flash ADC 104 is that it degrades the noise floor by 3 dB. This drawback can be alleviated by subtracting the same c[n], filtered by the computed noise transfer function impulse response h[k], from the ADC output 105 to generate a final digital output 105', as is shown in FIG. 2B.

Figure 2A:
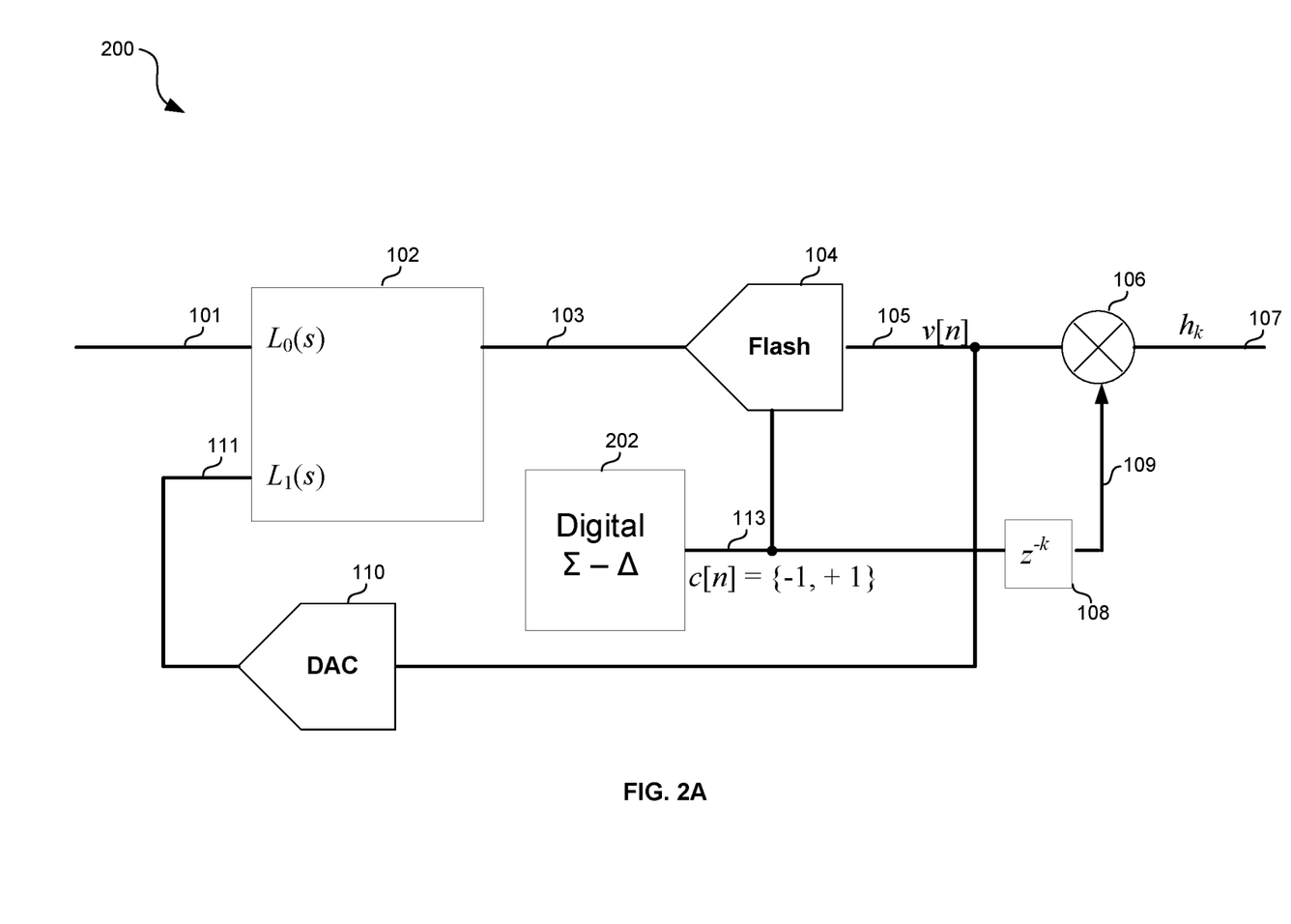
FIG. 2A shows an example implementation of the sigma-delta ADC of FIG. 1A with a noise-shaping sigma delta modulator generating the random sequence.
Figure 2B:
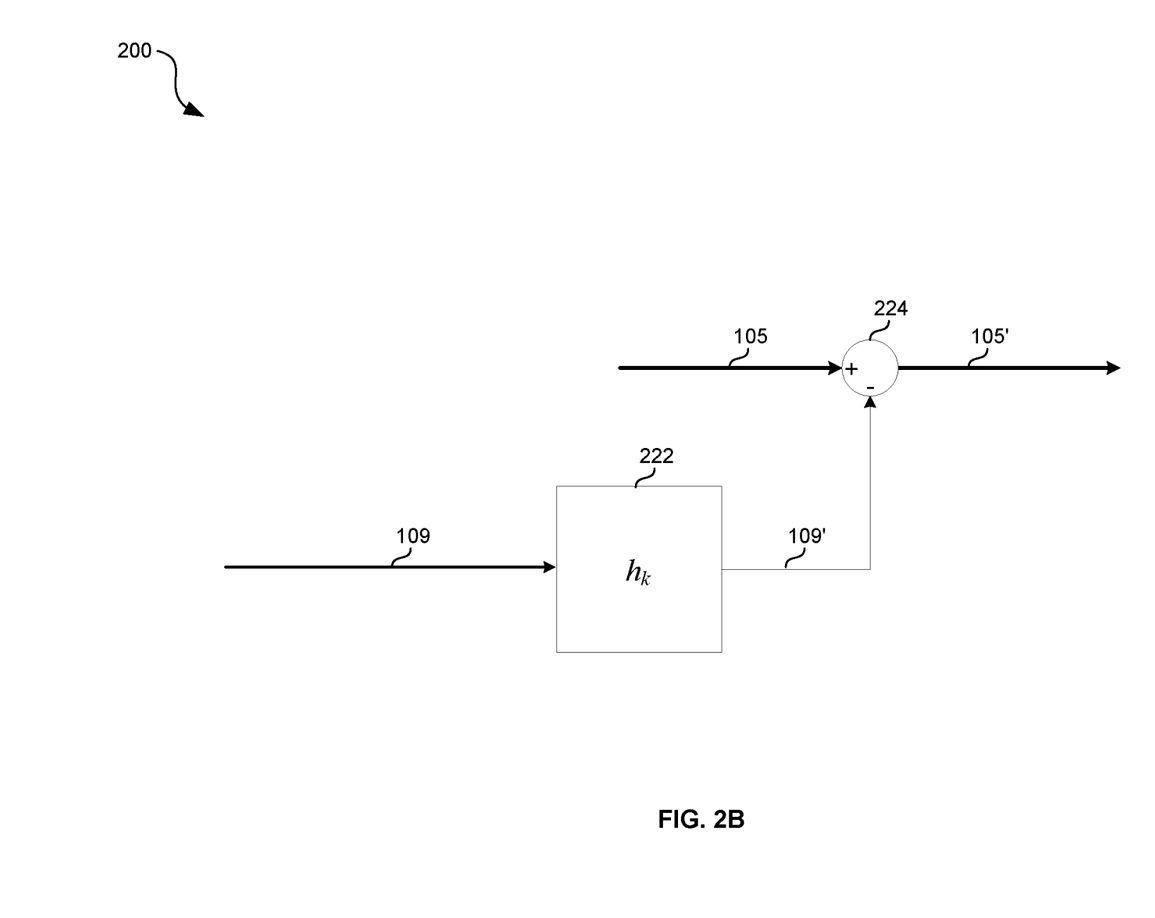
FIG. 2B illustrates one technic for mitigating the impact of the introduction of the random sequence in FIGS. 1A and 2A.

In FIG. 2B, the delayed sequence 109 is filtered by filer 222, which implements the noise transfer impulse response $h_k$ to generate 109' which is then subtracted, in subtractor 224, from the digital signal 105 resulting in final digital output 105'.

Additionally or alternatively, as shown in FIG. 2A, the impact to the noise floor can be alleviated by high-pass shaping c[n], via sigma-delta modulator 202, to push the error out to higher frequencies.

Figure 3:
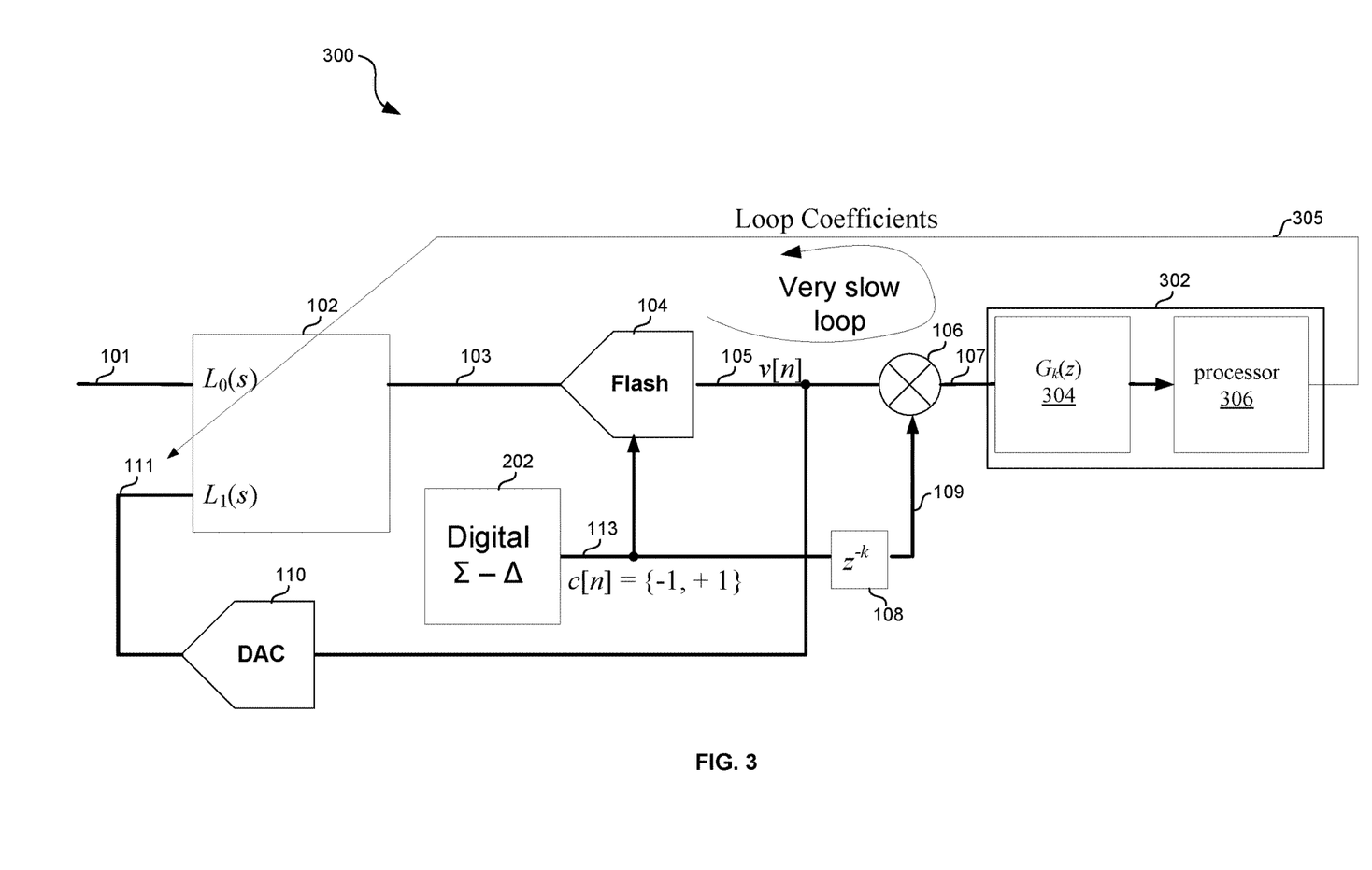
FIG. 3 shows the example sigma-delta ADC of FIG. 2 in a fully-adaptive configuration.

FIG. 3 shows the example sigma-delta ADC of FIG. 2A in a fully-adaptive configuration. In FIG. 3 the loop filter 102, flash ADC 104, sigma-delta modulator 202, delay circuit 108, DAC 110, and correlator circuit 106 are as previously described. Also shown is feedback circuit 302 comprising filter 304 and processor 306.

In an example implementation, the filter 304 realizes a transfer function $G_k(z)$, which is a low-pass filter for the $k^{th}$ noise transfer function impulse response coefficient. For example, $G_3(z)$ will be used to filter out the noise in $h_3$ to get a stable and robust average value.

The processor 306 is operable to solve a set of linear equations, using the output of filter 304, to generate the signal 305 which is feedback to the loop filter 102. In an example implementation, the processor 306 is operable to extract the loop coefficients pertaining to each integration order, which may be represented by arg min($h_k$−E{v[n]c[n−k]})$^2$, with the minima being found over loop parameters. The circuitry 302 thus enables adapting the loop coefficients in a controlled, slow manner to track voltage and temperature variations during run-time.

Figure 4A:
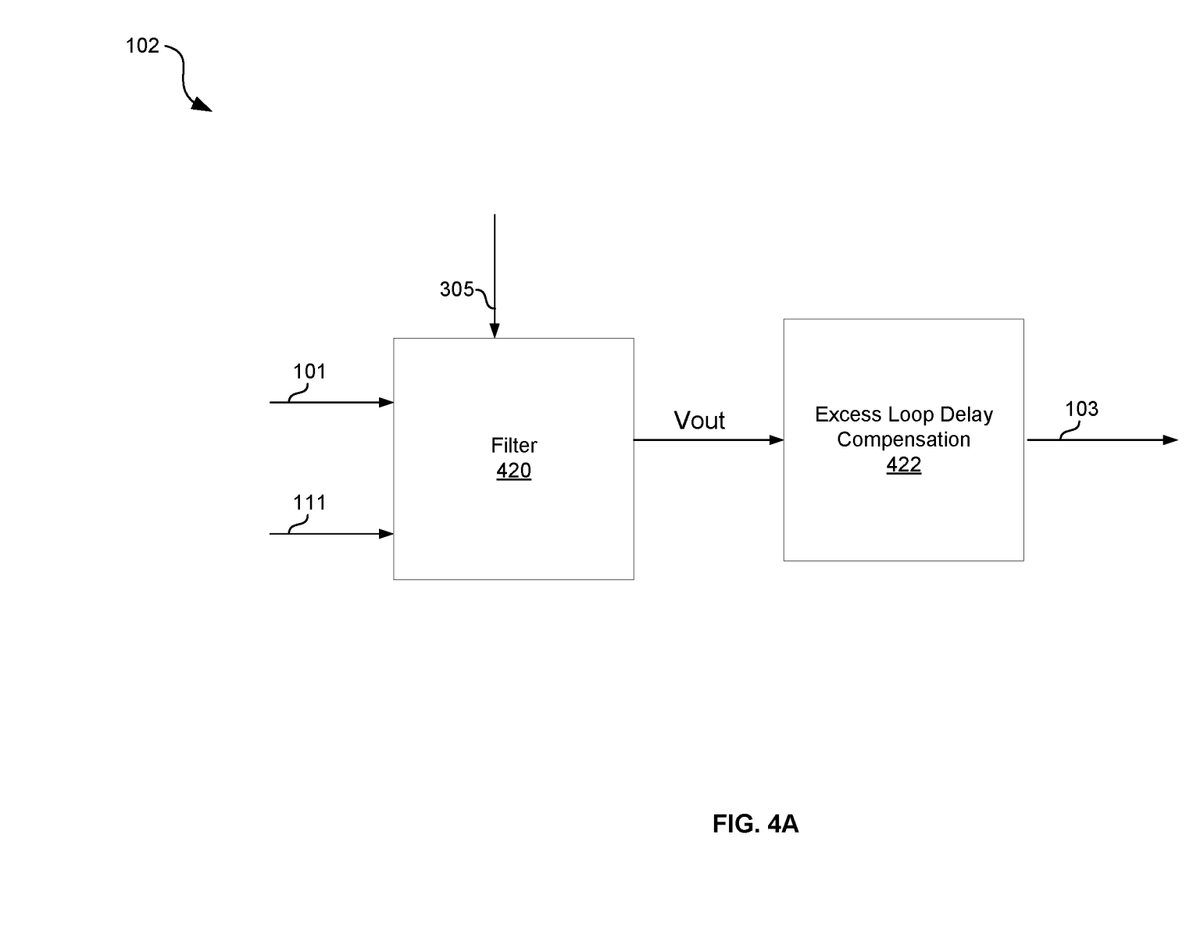
FIG. 4A shows example circuitry of the loop filter of FIGS. 1-3.

FIG. 4A shows example circuitry of the loop filter of FIGS. 1-3. The loop filter 102 comprises filter circuit 420 cascaded with excess loop delay (ELD) compensation circuit 422. The filter circuit 420 is configured by feedback signal 305. The output, Vout, of the filter circuit 420 is then passed to the ELD circuit 422, which outputs signal 103.

Figure 4B:
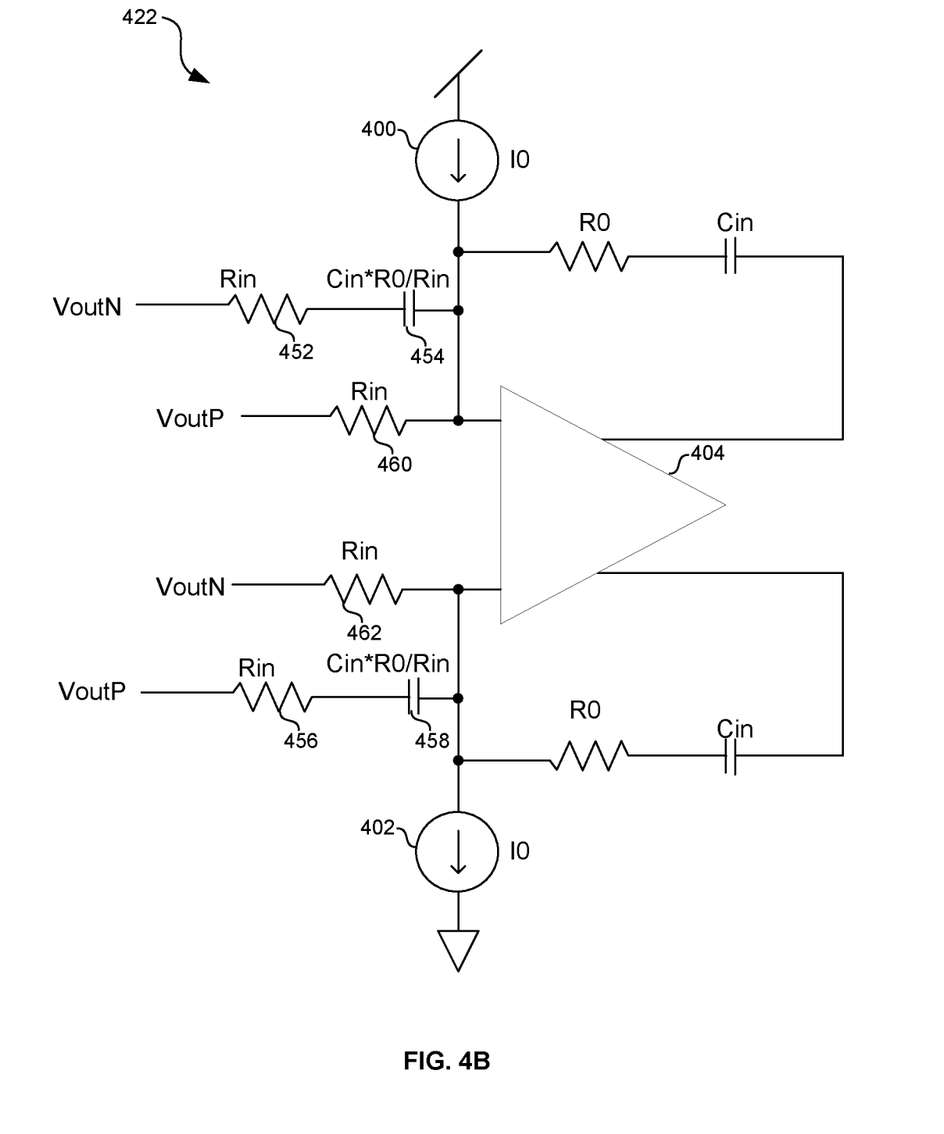
FIG. 4B shows an example implementation of the excess loop delay compensation circuit of FIG. 4A.

FIG. 4B shows an example implementation of the excess loop delay compensation circuit of FIG. 4A. The excess loop delay compensation circuitry 422 comprises current sources 400 and 402, op-amp 404, four resistors having a resistance of Rin, two resistors having a resistance of R0, two capacitors having a capacitance of Cin*R0/Rin, and two capacitors having a capacitance of Cin.

ELD direct path addition is one of the biggest challenges in building high performance continuous time sigma delta modulators. A fast path for direct addition of the ELD coefficient is desirable to ensure stability of the loop. The circuit 422 of FIG. 4 provides direct addition by reusing the last integrator opamp 404 of the loop filter along with another feedback DAC represented by the current sources 400 and 402. This architecture provides for direct path addition without adding an extra zero in the loop filter transfer function. Specifically, the addition of an auxiliary path from VoutP through resistor 452 (resistance Rin) and capacitor 454 (capacitance Cin*Ro/Rin), and from VoutN through resistor 456 (resistance Rin) and capacitor 458 (capacitance Cin*Ro/Rin) eliminates a zero in the signal transfer function.

In accordance with an example implementation of this disclosure, an analog-to-digital convertor circuit (e.g., 202) converts the output of a loop filter circuit (e.g., 103) to a digital signal (e.g., 153). A random sequence generation circuit (e.g., 112 or 202) generates a random sequence (e.g., 113). Adder circuitry (e.g., 154) adds the random sequence to the digital signal to generate a randomized digital signal (e.g., 105). Noise transfer function impulse response detection circuitry (e.g., 106) processes the randomized digital signal and the random sequence to determine a noise transfer function impulse response (e.g., $h_k$). Loop filter configuration circuitry (e.g., 302) configures the loop filter circuit based on the noise transfer function impulse response. The random sequence generation circuit may comprise a high-pass sigma delta modulator (e.g., 202). The noise transfer function impulse response detection circuitry may determine the noise transfer function impulse response, and the loop filter configuration circuitry may configure the loop filter (for instance, tuning the current-sources I0, 400 and 402 in FIG. 4B) to attain the desired noise transfer function impulse response. The configuration may comprise setting/adjusting coefficients of the loop filter. The randomized digital signal may be fed back to the loop filter via a digital-to-analog converter circuit (DAC) (e.g., 110). Noise compensation circuitry (e.g., 222 and 224) may generate a compensation signal (e.g., 109') by filtering (e.g., via 304) the random sequence based on the noise transfer function impulse response. The noise compensation circuitry may subtract the compensation signal from the randomized digital signal to generate a compensated, randomized digital signal (e.g., 105'). The compensated, randomized digital signal may be fed back to the loop filter circuit via a digital-to-analog converter circuit (DAC). The noise transfer function impulse response detection circuitry may determine a correlation between the random sequence and the randomized digital sequence. For each value of the random sequence, the addition of the random sequence to the digital signal corresponds to addition or subtraction of a value equal to 1 least significant bit of the ADC (i.e., the random sequence may take on values of +1 lsb and −1 lsb). The loop filter may comprise excess loop delay compensation circuitry (e.g., 422) which reuses a last integrator operational amplifier (e.g., 404) of the loop filter to provide direct path addition. A positive output of the loop filter (e.g., VoutP) may be applied to a first input of the operational amplifier through a first resistor (e.g., 460), and to a second input of the operational amplifier through a second resistor (e.g., 456) and a first capacitor (e.g., 458) in series. A negative output of the loop filter (e.g., VoutN) may be applied to the first input of the operational amplifier through a third resistor (e.g., 452) and a second capacitor (e.g., 454) in series, and to the second input of the operational amplifier through a fourth resistor (e.g., 462).

Aspects of the present disclosure provide methods and systems for estimating the impulse response of a continuous-time sigma-delta ADC and calculating the loop coefficients by solving simple linear equations. These methods and systems enable the robust design of a sigma-delta ADC, immune to component variation as well as loop timing variations. In various implementations, the estimation and correction of the loop timing may be performed in the foreground as and/or in the background.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
an analog-to-digital conversion circuit comprising a loop filter circuit, an analog-to-digital converter (ADC), a noise transfer function impulse response detection circuitry, a random sequence generation circuit, and loop filter configuration circuitry wherein:
an output of the loop filter circuit is converted to a digital signal by the ADC;
a random sequence generated by the random sequence generation circuit is added to the digital signal to generate a randomized digital signal;
the noise transfer function impulse response detection circuitry is configured to process the randomized digital signal and the random sequence to determine a noise transfer function impulse response; and
the loop filter configuration circuitry is operable to configure the loop filter circuit based on the noise transfer function impulse response.

2. The system of claim 1, wherein the random sequence generation circuit comprises a high-pass sigma delta modulator.

3. The system of claim 1, wherein the loop filter configuration circuitry configures the loop filter circuit based on the noise transfer function impulse response determined by the noise transfer function impulse response detection circuitry.

4. The system of claim 3, wherein the loop filter configuration circuitry is operable to generate loop filter coefficients based on the noise transfer function impulse response.

5. The system of claim 1, comprising a digital-to-analog converter circuit (DAC), wherein the randomized digital signal is fed back to the loop filter circuit via the DAC.

6. The system of claim 1, comprising a noise compensation circuit operable to:

generate a compensation signal by filtering the random sequence based on the noise transfer function impulse response; and
subtract the compensation signal from the randomized digital signal to generate a compensated, randomized digital signal.

7. The system of claim 6, comprising a digital-to-analog converter circuit (DAC), wherein the compensated, randomized digital signal is fed back to the loop filter circuit via the DAC.

8. The system of claim 1, wherein the noise transfer function impulse response detection circuitry is operable to determine a correlation between the random sequence and the randomized digital signal.

9. The system of claim 1, wherein, for each value of the random sequence, the addition of the random sequence to the digital signal corresponds to addition or subtraction of a value equal to 1 least significant bit of the ADC.

10. The system of claim 1, wherein the loop filter circuit comprises excess loop delay compensation circuitry which reuses a last integrator operational amplifier of the loop filter circuit to provide direct path addition.

11. The system of claim 10, wherein:
a positive terminal of the output of the loop filter circuit is applied to a first input of the operational amplifier through a first resistor and to a second input of the operational amplifier through a second resistor and a first capacitor in series;
a negative terminal of the output of the loop filter circuit is applied to the first input of the operational amplifier through a third resistor and a second capacitor in series and to the second input of the operational amplifier through a fourth resistor.

12. A method comprising:
converting, by an analog-to-digital convertor circuit (ADC) an output of a loop filter circuit to a digital signal;
generating, by a random sequence generation circuit, a random sequence;
adding, by adder circuitry, the random sequence to the digital signal to generate a randomized digital signal;
processing, by noise transfer function impulse response detection circuitry, the randomized digital signal and the random sequence to determine a noise transfer function impulse response; and
configuring, by loop filter configuration circuitry, the loop filter circuit based on the noise transfer function impulse response.

13. The method of claim 12, wherein the random sequence generation circuit comprises a high-pass sigma delta modulator.

14. The method of claim 12, comprising:
determining, by the noise transfer function impulse response detection circuitry, the noise transfer function impulse response; and
configuring, by the loop filter configuration circuitry, the loop filter circuit based on the noise transfer function impulse response.

15. The method of claim 14, comprising generating, by the loop filter configuration circuitry, loop filter coefficients based on the noise transfer function impulse response.

16. The method of claim 12, comprising feeding the randomized digital signal back to the loop filter circuit via a digital-to-analog converter circuit (DAC).

17. The method of claim 12, comprising:
generating, by noise compensation circuitry, a compensation signal by filtering the random sequence based on the noise transfer function impulse response; and
subtracting the compensation signal from the randomized digital signal to generate a compensated, randomized digital signal.

18. The method of claim 17, comprising feeding the compensated, randomized digital signal to the loop filter circuit via a digital-to-analog converter circuit (DAC).

19. The method of claim 12, comprising determining, by the noise transfer function impulse response detection circuitry, a correlation between the random sequence and the randomized digital signal.

20. The method of claim 12, wherein, for each value of the random sequence, the addition of the random sequence to the digital signal corresponds to addition or subtraction of a value equal to 1 least significant bit of the ADC.

* * * * *